(12) United States Patent
Park

(10) Patent No.: US 7,064,350 B2
(45) Date of Patent: Jun. 20, 2006

(54) ORGANIC ELECTROLUMINESCENT DISPLAY DEVICE AND METHOD OF FABRICATING THE SAME

(75) Inventor: Jae-Yong Park, Gyeonggi-do (KR)

(73) Assignee: LG.Philips LCD Co., Ltd. (KR)

( * ) Notice: Subject to any disclaimer, the term of this patent is extended or adjusted under 35 U.S.C. 154(b) by 121 days.

(21) Appl. No.: 10/876,690

(22) Filed: Jun. 28, 2004

(65) Prior Publication Data

US 2005/0139821 A1    Jun. 30, 2005

(30) Foreign Application Priority Data

Dec. 30, 2003    (KR) ...................... 10-2003-0100675

(51) Int. Cl.
*H01L 29/04* (2006.01)
(52) U.S. Cl. .......................... 257/72; 438/69
(58) Field of Classification Search .................. 438/29, 438/30, 69, 149, 151; 257/59, 72, 98
See application file for complete search history.

(56) References Cited

U.S. PATENT DOCUMENTS 6,515,428 B1 *    2/2003    Yeh et al. ................. 315/169.3

* cited by examiner

*Primary Examiner*—David Vu
(74) *Attorney, Agent, or Firm*—Morgan Lewis & Bockius LLP

(57) ABSTRACT

An organic electroluminescent device includes first and second substrates spaced apart from and attached to each other, the first and second substrates including a plurality of pixel regions and a periphery region surrounding the plurality of pixel regions, a plurality of gate lines on an inner surface of the first substrate, a plurality of data lines crossing the plurality of gate lines, a plurality of driving thin film transistors, each of the driving thin film transistors adjacent to one of the plurality of pixel regions, a plurality of power lines connected to the driving thin film transistors, a plurality of gate pads connected to an end portion of the gate lines within the periphery region, a plurality of data pads connected to an end portion of the data lines within the periphery region, a plurality of power pads connected to an end portion of the power lines within the periphery region, at least one dummy pad within the periphery region, the at least one dummy pad being independent of each of the gate pads, the data pads, and the power pads, a first electrode on an inner surface of the second substrate, the first electrode connected to the dummy pad, an organic electroluminescent layer on the first electrode, a plurality of second electrodes on the organic electroluminescent layer within each of the pixel regions, and a plurality of connection electrodes electrically interconnecting the first substrate with the second substrate.

37 Claims, 17 Drawing Sheets

ORGANIC ELECTROLUMINESCENT DISPLAY DEVICE AND METHOD OF FABRICATING THE SAME

The present invention claims the benefit of Korean Patent Application No. 2003-0100675, filed in Korea on Dec. 30, 2003, which is hereby incorporated by reference.

BACKGROUND OF THE INVENTION

1. Field of the Invention

The present invention relates to an organic electroluminescent display (OELD) device and a method of fabricating an OELD device, and more particularly, to a dual-plate OELD device and a method of fabricating a dual plate OELD device.

2. Discussion of the Related Art

In general, an OELD device emits light by injecting electrons from a cathode and injecting holes from an anode into an emission layer, combining the electrons with the holes, generating an exciton, and transitioning the exciton from an excited state to a ground state. Unlike liquid crystal display (LCD) devices, an additional light source is not necessary for an OELD device to emit light since the transition of the exciton between the excited and ground states causes light to be emitted from the emission. Accordingly, the size and weight of the OELD device is less than that of an LCD device. In addition, the OELD device has low power consumption, superior image brightness, and fast response times. Thus, the OELD devices are employed in consumer electronic applications, such as cellular phones, car navigation systems (CNS), personal digital assistants (PDA), camcorders, and palmtop computers. Moreover, since the fabrication process for manufacturing the OELD devices is a relatively simple process, it is much less costly to produce an OELD device than it is to produce an LCD device.

Presently, at least two different types of OELD devices exist: passive matrix OELD devices and active matrix OELD devices. Although the passive matrix OELD devices have simple structures and are formed by simple fabrication processes, passive matrix OELD devices require a relatively high amount of power to operate. In addition, the display size of passive matrix OELD devices is limited due to their structure. Furthermore, as a number of conductive lines increases in a passive matrix OELD device, an aperture ratio of the passive matrix OELD devices decreases. On the other hand, active matrix OELD devices have a high emission efficiency and can produce high-quality images for larger displays with relatively low power consumption.

FIG. 1 is a schematic cross sectional view of an OELD device according to the related art. In FIG. 1, an OELD device 10 includes first and second substrates 12 and 28 that are spaced apart from each other and bonded together using a sealant 26. The first substrate 12 includes an array layer 14 having a thin film transistor (TFT) "T" formed on an inner surface of the first substrate 12, wherein a first electrode 16, an organic electroluminescent (EL) layer 18, and a second electrode 20 are sequentially formed on the array layer 14. The organic EL layer 18 may include red, green, and blue emission layers to display full-color images, and each of the red, green, and blue emission layers may be located in each pixel region "P."

The second substrate 28 includes a moisture absorbent desiccant 22 that eliminates moisture and oxygen that may penetrate into the organic EL layer 18. The moisture absorbent desiccant 22 is disposed within an etched portion of the second substrate 28, and is fixed by a holding element 25.

FIG. 2 is a schematic plan view of an array layer of an OELD device according to the related art. In FIG. 2, an array layer of an OELD device includes a switching element $T_S$, a driving element $T_D$, and a storage capacitor $C_{ST}$ formed on a transparent insulating substrate 12, such as glass or plastic, wherein the switching element $T_S$ and the driving element $T_D$ may include a combination of at least one TFT. In addition, a gate line 32 and a data line 34 crossing each other are formed on the substrate 12, wherein a pixel region P is defined by crossing of the gate line 32 and the data line 34. An insulating layer (not shown) is interposed between the gate line 32 and the data line 34, and a power line 35 is disposed parallel to and spaced apart from the data line 34 and also crosses over the gate line 32.

In FIG. 2, the switching element $T_S$ is a TFT that includes a switching gate electrode 36, a switching active layer 40, a switching source electrode 46, and a switching drain electrode 50. Similarly, the driving element $T_D$ is a TFT that includes a driving gate electrode 38, a driving active layer 42, a driving source electrode 48 and a driving drain electrode 52. The switching gate electrode 36 is connected to the gate line 32, and the switching source electrode 46 is connected to the data line 34. The switching drain electrode 50 is connected to the driving gate electrode 38 via a first contact hole 54, and the driving source electrode 48 is connected to the power line 35 via a second contact hole 56. In addition, the driving drain electrode 52 is connected to a first electrode 16 at the pixel region P. The power line 35 overlaps a first capacitor electrode 15 with the insulating layer interposed therebetween to form the storage capacitor $C_{ST}$.

FIG. 3 is a schematic plan view of an OELD device according to the related art. In FIG. 3, a substrate 12 includes a data pad part F1, a gate pad part F2, and power supply pad part E, wherein the data pad part F1, a gate pad part F2, and power supply pad part E are located along first and second sides and a third sides adjacent to the first side, respectively. The power supply pad part E is located at an end part of the power supply line 35 (in FIG. 2). In addition, a ground pad is formed along the first side and provides a ground signal to the second electrode 20 (in FIG. 1), such as cathode, to maintain an electric potential of the second electrode 20 (in FIG. 1).

FIG. 4A is a schematic cross sectional view along IVa—IVa of FIG. 2 according to the related art, and FIG. 4B is a schematic cross sectional view along IVb—IVb of FIG. 3 according to the related art. In FIGS. 4A and 4B, a driving TFT $T_D$ is formed on a substrate 12 and includes a driving active layer 42, a driving gate electrode 38, a driving source electrode 48, and a driving drain electrode 52. In addition, an insulating layer 57 is formed on the driving TFT $T_D$, and a first electrode 16 is formed on the insulating layer 57 and is connected to the driving drain electrode 52. An organic EL layer 18 is formed on the first electrode 16, and a second electrode 20 is formed on the organic EL layer 18. The first and second electrodes 16 and 20 and the organic EL layer 18 interposed therebetween constitute an OEL diode $D_{EL}$. As shown in FIG. 2, a storage capacitor $C_{ST}$ is disposed to be electrically parallel with the driving TFT $T_D$ includes first and second capacitor electrodes 15 and 35a, wherein a portion of the power line 35 (in FIG. 2) overlapping the first capacitor electrode 15 is used as the second capacitor electrode 35a, and the second capacitor electrode 35a is connected to the driving source electrode 56. The second electrode 20 is formed over the substrate 12 including the driving TFT $T_D$, the storage capacitor $C_{ST}$, and the organic EL layer 18.

In FIG. 3, a common electrode 39 is formed along a peripheral portion of the substrate 12 and supplies a common voltage to the second electrode 20. In addition, the common electrode 39 is simultaneously formed with the switching gate electrode 36 (in FIG. 2) and the driving gate electrode 38. Although not shown, multiple insulating layers are formed on the common electrode 39 and include first and second common contact holes 50 and 52 that expose a portion of the common electrode 39. Accordingly, the second electrode 20 is connected to the common electrode 39 via the first common contact hole 50. In addition, an outer IC (not shown) is connected to the common electrode 39 via the second common contact hole 52 in order to supply the common voltage with the common electrode 39.

However, when an array layer of TFTs and organic EL diodes are all formed on a single substrate, production yield of an OELD device is determined by a product of the TFT's yield and the organic EL layer's yield. Since the organic EL layer's yield is relatively low, the production yield of the OELD device is limited by the organic EL layer's yield. For example, even when a TFT is properly fabricated, an OELD device can be determined to be unacceptable due to defects of the organic EL layer using a thin film of about 1000 Å thickness. Accordingly, this limitation causes loss of materials and an increase in production costs.

OELD devices are classified into one of bottom emission-type OELD devices and top emission-type OELD devices according to a transparency of the first and second electrodes and of the organic EL diode. The bottom emission-type OELD devices are advantageous for their high image stability and variable fabrication processing due to encapsulation. However, the bottom emission-type OELD devices are not adequate for implementation in display devices that require high resolution due to the limitations of the increased aperture ratio. On the other hand, since top emission-type OELD devices emit light along a direction upward of the substrate, the light can be emitted without influencing the array layer that is located under the organic EL layer. Accordingly, the overall design of the array layer including $TFT_S$ may be simplified. In addition, the aperture ratio can be increased, thereby increasing the operational life span of the organic ELD. However, since a cathode is commonly formed over the organic EL layer in the top emission-type OELD devices, material selection and light transmittance are limited such that light transmission efficiency is lowered. If a thin film type passivation layer is formed to prevent a reduction of the light transmittance, the thin film type passivation layer may fail to prevent infiltration of exterior air into the device.

SUMMARY OF THE INVENTION

Accordingly, the present invention is directed to an OELD device and a method of fabricating an OELD device that substantially obviate one or more of the problems due to limitations and disadvantages of the related art.

An object of the present invention is to provide an OELD device having an array layer and an organic electroluminescent diode on respective substrates.

Another object of the present invention is to provide a method of fabricating an OELD device having an array layer and an organic electroluminescent diode on respective substrates.

Another object of the present invention is to provide an OELD device having uniform image quality.

Another object of the present invention is to provide a method of fabricating an OELD device having uniform image quality.

Additional features and advantages of the invention will be set fourth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes first and second substrates spaced apart from and attached to each other, the first and second substrates including a plurality of pixel regions and a periphery region surrounding the plurality of pixel regions, a plurality of gate lines on an inner surface of the first substrate, a plurality of data lines crossing the plurality of gate lines, a plurality of driving thin film transistors, each of the driving thin film transistors adjacent to one of the plurality of pixel regions, a plurality of power lines connected to the driving thin film transistors, a plurality of gate pads connected to an end portion of the gate lines within the periphery region, a plurality of data pads connected to an end portion of the data lines within the periphery region, a plurality of power pads connected to an end portion of the power lines within the periphery region, at least one dummy pad within the periphery region, the at least one dummy pad being independent of each of the gate pads, the data pads, and the power pads, a first electrode on an inner surface of the second substrate, the first electrode connected to the dummy pad, an organic electroluminescent layer on the first electrode, a plurality of second electrodes on the organic electroluminescent layer within each of the pixel regions, and a plurality of connection electrodes electrically interconnecting the first substrate with the second substrate.

In another aspect, a method of fabricating an organic electroluminescent device includes forming a plurality of gate lines, data lines, and power lines on an inner surface of a first substrate having a plurality of pixel regions and a periphery region surrounding the plurality of pixel regions, forming a plurality of driving thin film transistors adjacent to each of the plurality of pixel regions on the inner surface of the first substrate, forming a plurality of gate pads, data pads, and power pads connected to an end portions of the gate lines, the data lines, and the power lines, respectively, within the periphery region, forming at least one dummy pad within the periphery region independent of the gate pads, the data pads, and the power pads, forming a first electrode on an inner surface of a second substrate having the plurality of pixel regions and the periphery region, forming an organic electroluminescent layer on the first electrode, forming a plurality of second electrodes on the organic electroluminescent layer within each of the pixel regions, forming a plurality of connection electrodes on one of first and second substrates, and electrically interconnecting the first substrate and the second substrate through the connection electrodes and at least one dummy pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
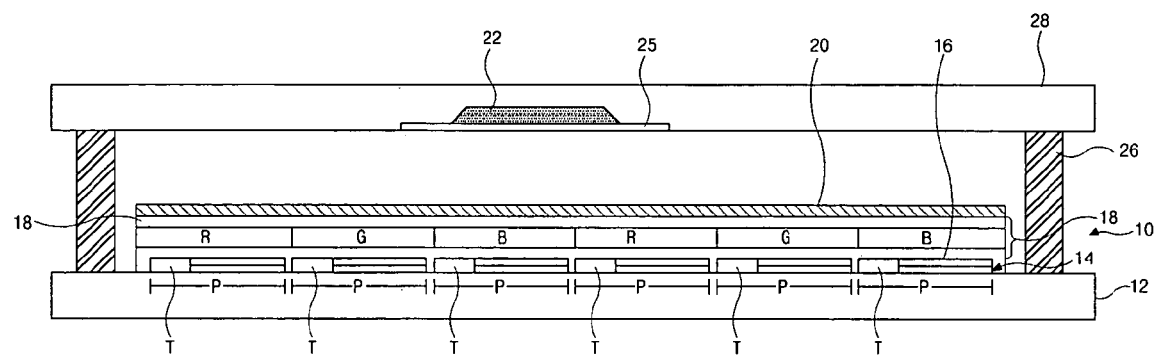
FIG. 1 is a schematic cross sectional view of an OELD device according to the related art.
Figure 2:
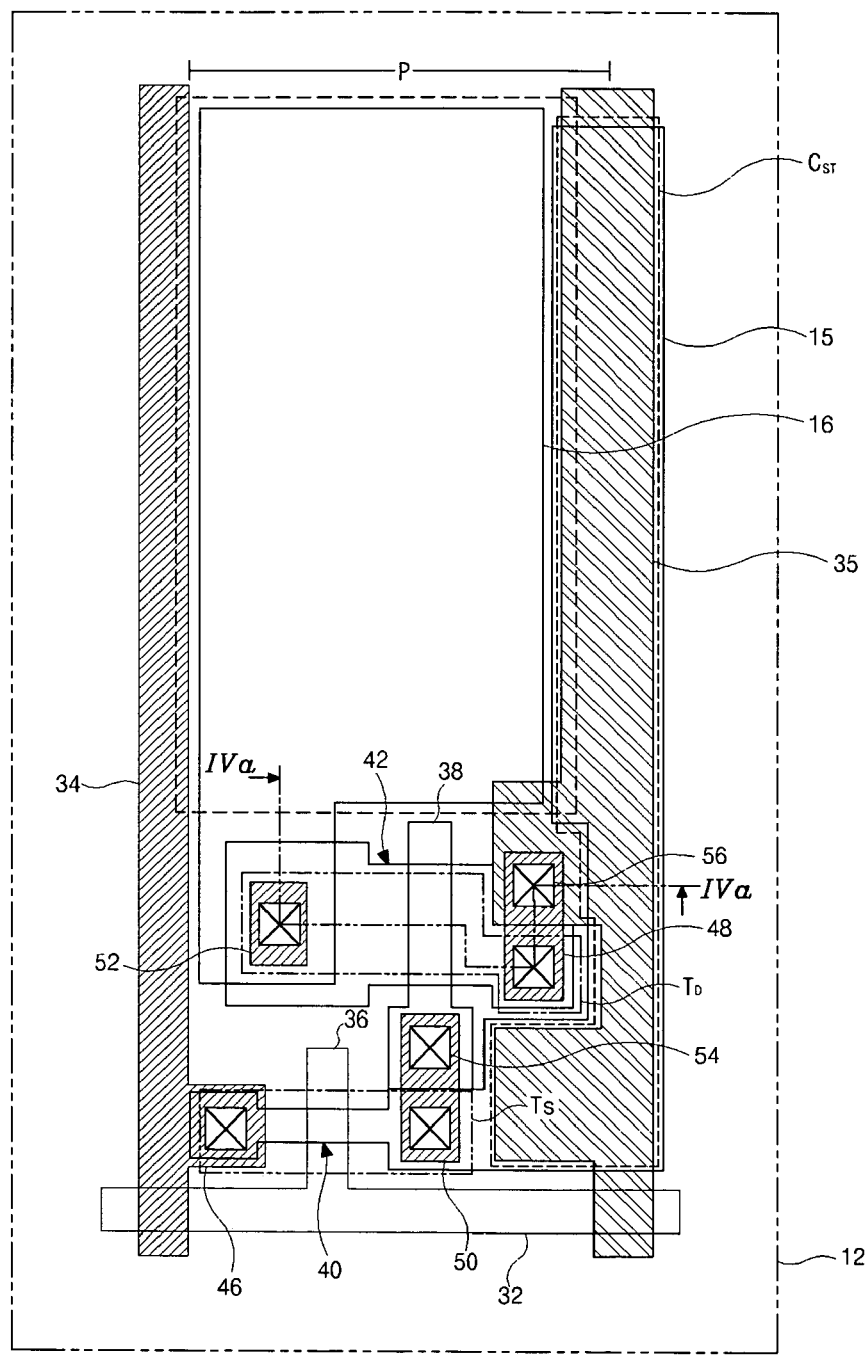
FIG. 2 is a schematic plan view of an array layer of an OELD device according to the related art.
Figure 3:
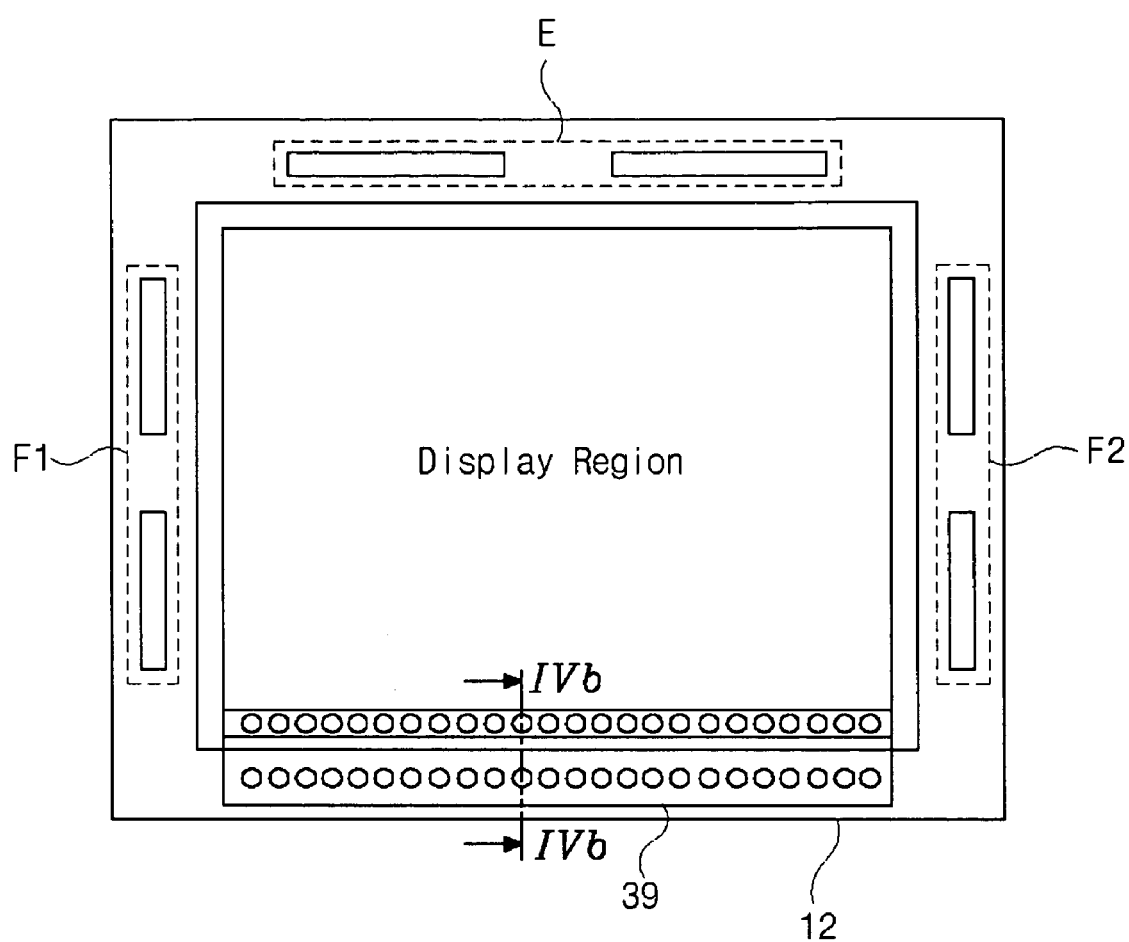
FIG. 3 is a schematic plan view of an OELD device according to the related art.
Figure 4A:
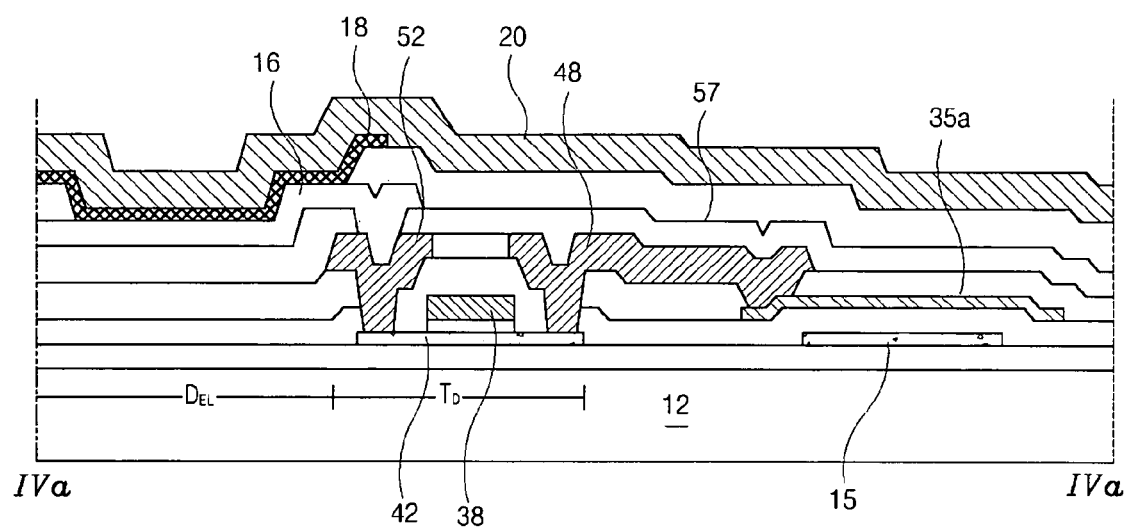
FIG. 4A is a schematic cross sectional view along IVa—IVa of FIG. 2 according to the related art.
Figure 4B:
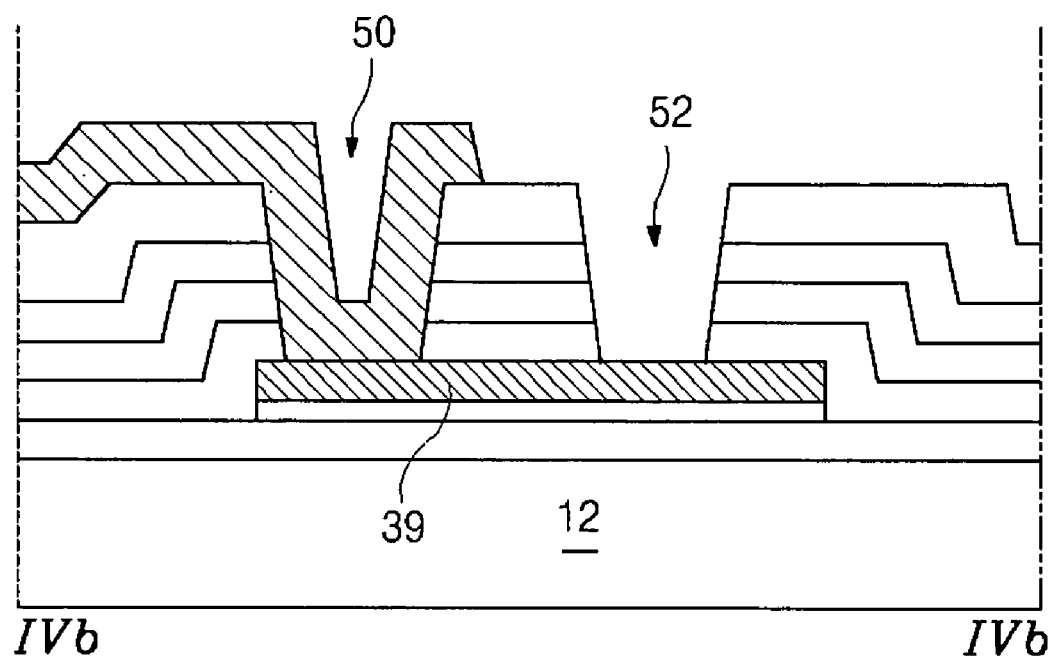
FIG. 4B is a schematic cross sectional view along IVb—IVb of FIG. 3 according to the related art.
Figure 5:
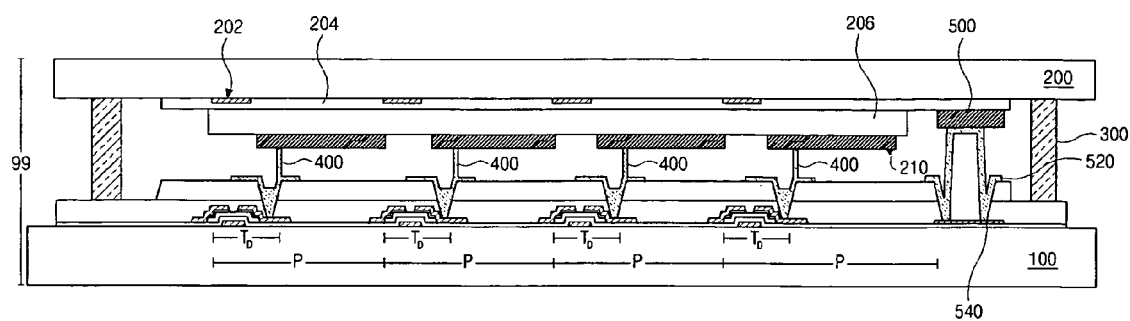
FIG. 5 is a schematic cross sectional view of an exemplary dual-plate OELD device according to the present invention.

FIG. 5 is a schematic cross sectional view of an exemplary dual-plate OELD device according to the present invention. In FIG. 5, an OELD device 99 may include a first substrate 100 and a second substrate 200 spaced apart from and attached to the first substrate 100 using a sealant 300. Although not shown, an array element layer and an organic electroluminescent diode may be formed on the first and second substrates 100 and 200, respectively, and a display region and a periphery region surrounding the display region may be defined in the first and second substrates 100 and 200.

In FIG. 5, a plurality of pixel regions P may be provided within the display region, and a switching TFT (not shown) and a driving TFT $T_D$ may be formed on an inner surface of the first substrate 100 in each of the pixel regions P. Although not shown in FIG. 5, a plurality of array lines may be formed on the inner surface of the first substrate 100.

A first electrode 204 may be formed along an inner surface of the second substrate 200. In addition, an organic electroluminescent (OEL) layer 206 may be formed on the first electrode 204, and a plurality of the second electrodes 210 may be formed on the OEL layer 206. Each of the second electrodes 210 may be independently located in each of the pixel regions P. When the first electrode 204 functions as an anode, it may be made of a transparent conductive metallic material having a higher resistance than an opaque metallic material. A plurality of first auxiliary electrodes 202 may be formed between the first and second electrodes 204 and 210 and to prevent resistance problems of the first electrode 204. Accordingly, the first auxiliary electrodes 202 may be located along the boundary of each of the pixel regions P, and may be made of a metallic material having a lower resistance than the first electrode 204. In addition, the first and second substrates 100 and 200 may be electrically interconnected, wherein the second electrode 210 may be connected to the driving TFT $T_D$ through a connection electrode 400 located in each of the pixel regions P. Thus, the connection electrodes 400 may be formed on the first substrate 100, wherein each of the connection electrodes 400 and the second electrodes 210 may be connected to each other by attaching the first and second substrates 100 and 200 together.

In FIG. 5, a second auxiliary electrode 500 may be formed along a periphery of the second substrate 200, and may be made of a metallic material having a low resistance, such as using the same material of the second electrodes 210. In addition, at least one dummy pad DP 540 and contact electrode 520 may be sequentially formed on the first electrode 204. Accordingly, signals of outer ICs may be supplied to the first electrode 204 through connecting the second auxiliary electrode 500 and contact electrode 520. Thus, the second auxiliary electrode 500 may be used as a signal supplying system for the first electrode 204 in order to be lower in electrical resistance than the first electrode 204. Accordingly, pads (not shown) for connecting Tape Carrier Package (TCP) or for Flexible Panel Connector (FPC) may not be necessary.

Figure 6:
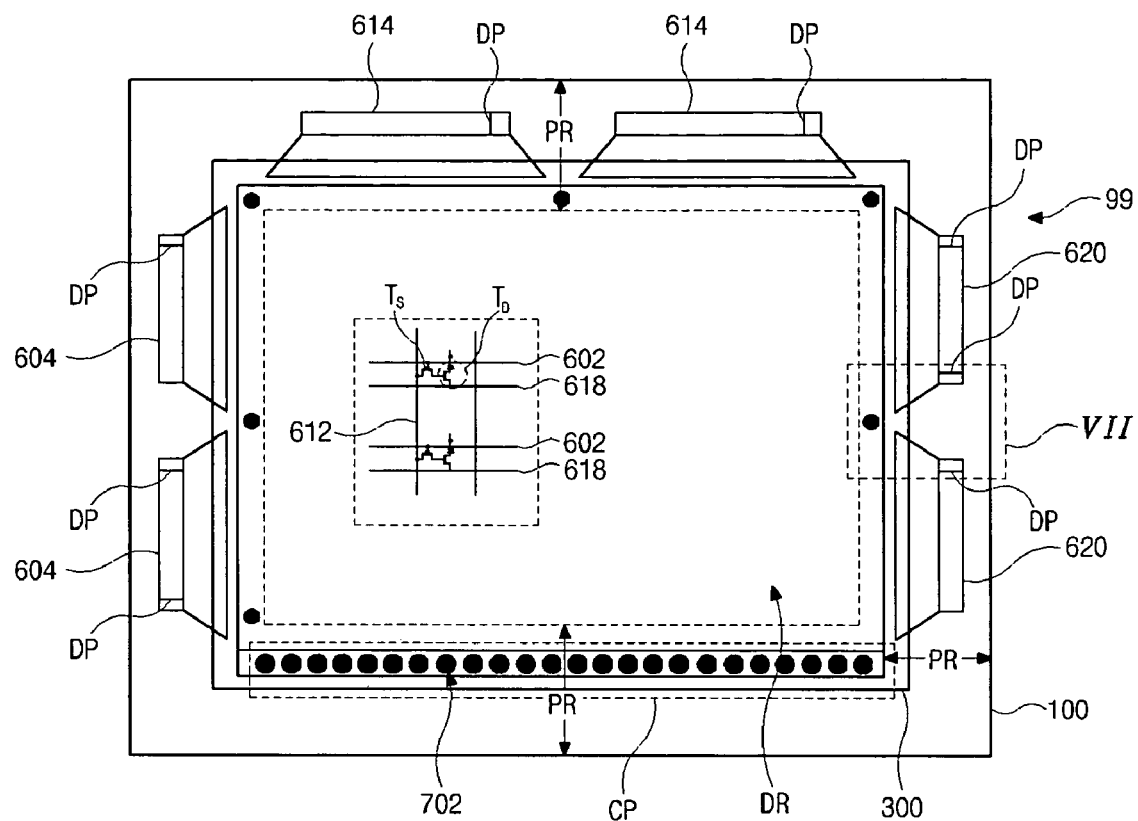
FIG. 6 is a schematic plan view of another exemplary dual-plate OELD device according to the present invention.

FIG. 6 is a schematic plan view of another exemplary dual-plate OELD device according to the present invention. In FIG. 6, an OELD device 99 may include a first substrate 100 and a second substrate 200 (in FIG. 5) spaced apart from the first substrate 100 and attached together using a seal pattern 300. Although not shown, an array element layer and an organic electroluminescent diode may be formed on the first and second substrates 100 and 200, respectively. In addition, an organic electroluminescent (OEL) diode may comprise an anode, an electroluminescent layer, and a cathode.

The OELD device 99 may include a display region DR and a periphery region PR surrounding the display region DR. In addition, a plurality of gate lines 602, data lines 612, and power lines 618 may be formed on the first substrate 100 within the display region DR. Moreover, a plurality of gate pad groups 604, a plurality of data pad group 614, and a plurality of ground pad group 620 may be formed at an end portion of the gate lines 602, data lines 612, and power lines 618, and may be located in first, second, and third portions (not shown) of the periphery region PR, respectively.

In FIG. 6, at least one dummy pad DP may be formed in the first, second, and third portions of the periphery region PR. For example, the gate pad group 604, the data pad group 614, and the ground pad group 620 may all include dummy pads DP along both sides thereof. Although not shown, the dummy pads DP may be connected to the first electrode 204 (in FIG. 5) through the contact electrode 520 (in FIG. 5).

In FIG. 6, a contact part 700 may be located in a fourth portion (not shown) of the periphery region PR, and may include a plurality of contact holes 702. Accordingly, signals of outer ICs may be supplied to the first electrode 204 through the contact part 700 that may be connected to the first electrode 204 via the contact holes 702. In addition, the contact part 700 may be located inside the seal pattern 300 and may include a contact metal line (not shown) connecting the outer ICs, or printed circuit board (PCB), and the first electrode 204 (in FIG. 5).

Figure 7:
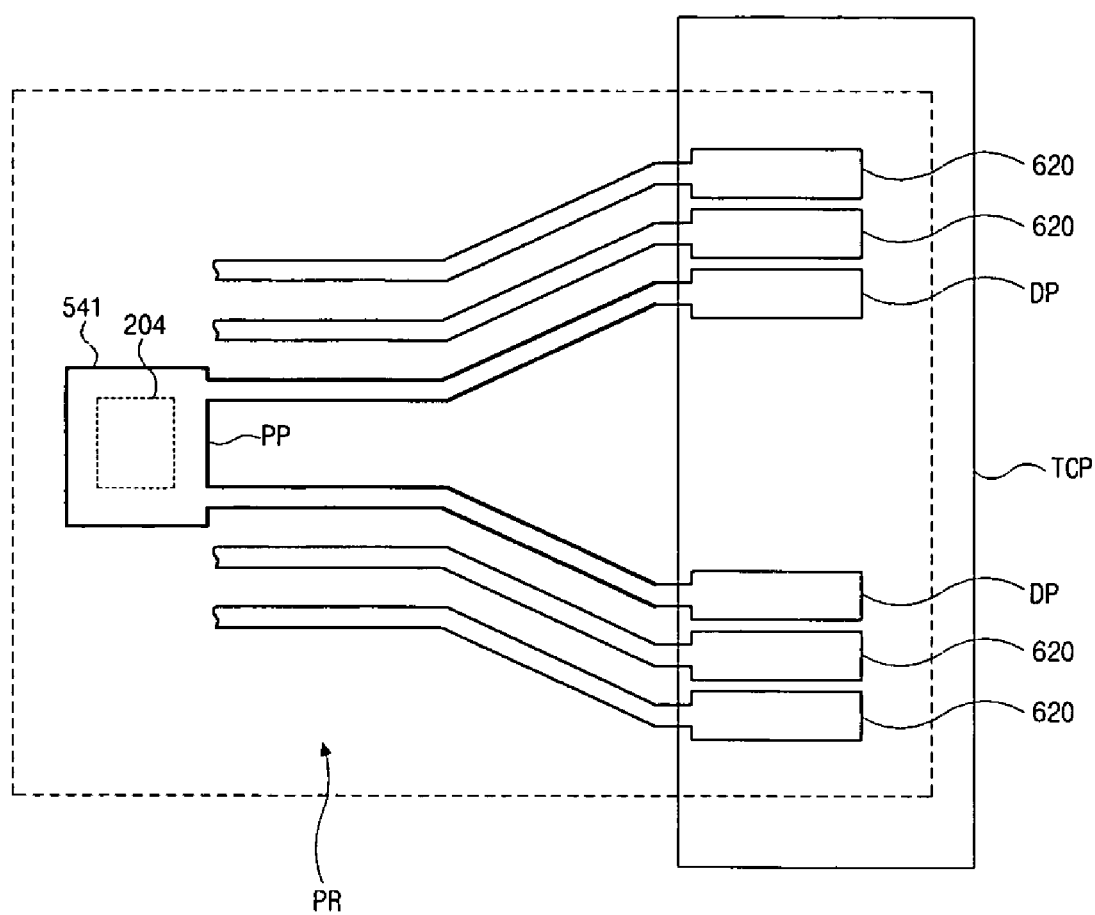
FIG. 7 is an expanded plan view of region VII of the FIG. 6 according to the present invention.

FIG. 7 is an expanded plan view of region VII of the FIG. 6 according to the present invention. In FIG. 7, a plurality of pads 620 and a plurality of dummy pads DP may be located along a periphery region PR of a display region (not shown) of an OELD device. Although not shown, one side of the pads 620 may be connected to a plurality of lines in the display region, and the dummy pads DP may not be connected to the lines. For example, the dummy pads DP may be independently formed and may have a contact part 541 connected to the first electrode 204. In addition, the other side of the pads 620 may be connected to a TCP packaging a driving IC (not shown), and the dummy pad DP may be connected to the driving IC in order to supply signals of the outer ICs to the first electrode 204.

According to the present invention, an OELD device may have dummy pads to provide for uniform image quality without using an additional signal supplying system. Thus, the same signals may be simultaneously supplied to at least both regions of the OELD device. Furthermore, the OELD device may distribute signals even when the OELD device is employed in a large-sized display. Thus, the OELD device may have a simplified fabrication process and reduced production costs.

FIGS. 8A to 8E, 9A to 9E, and 10A to 10E are schematic cross sectional views of an exemplary method of fabricating a dual-plate OELD device according to the present invention. For example, FIGS. 8A to 8E and 9A to 9E show an exemplary display region, and FIGS. 10A to 10E show an exemplary periphery region having dummy pads.

Figure 8A:
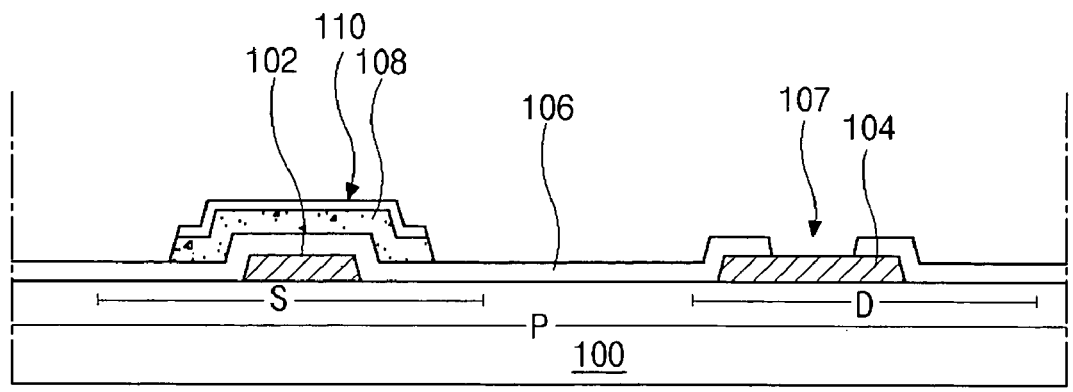
FIGS. 8A to 8E, 9A to 9E, and 10A to 10E are schematic cross sectional views of an exemplary method of fabricating a dual-plate OELD device according to the present invention.
Figure 9A:
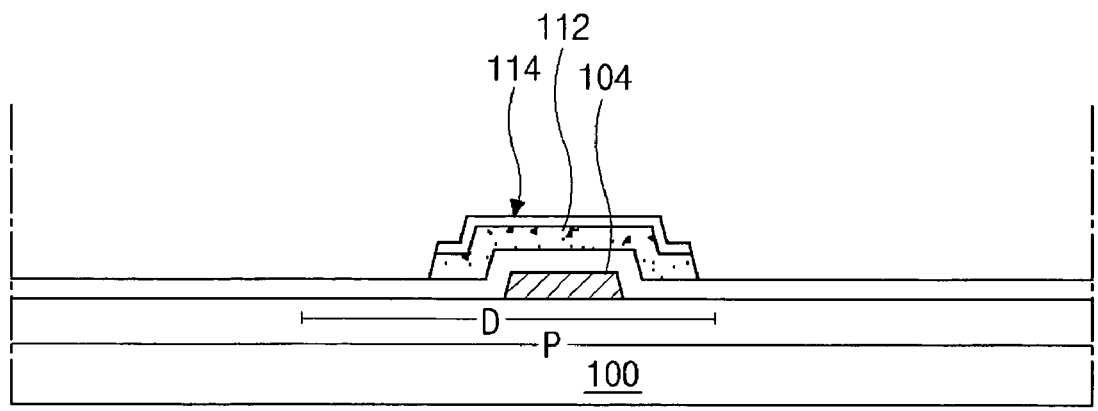
Figure 10A:
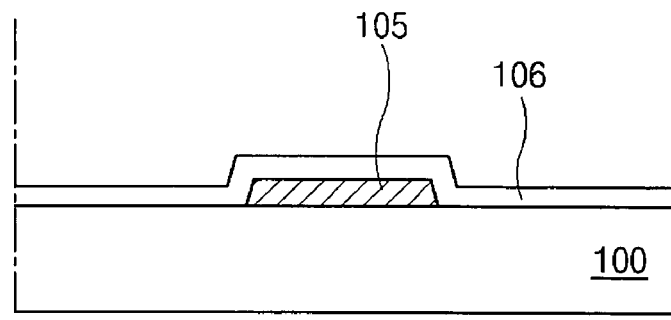

In FIGS. 8A, 9A, and 10A, a switching region S, a driving region D, and a pixel region P may be defined in a first substrate 100. In addition, first and second gate electrodes 102 and 104 may be formed on the switching region S and the driving region D by depositing and patterning a conductive metallic material, such as aluminum (Al), Al alloy, copper (Cu), tungsten (W), tantalum (Ta), and molybdenum (Mo). Furthermore, a gate dummy pad 105 may be made of the same material of the first and second gate electrodes 102 and 104.

In FIGS. 8A, 9A, and 10A, a gate-insulating layer 106 may be formed along an entire surface of the first substrate 100 having the first and second gate electrodes 102 and 104 by depositing an inorganic insulating material, such as silicon nitride (SiNx) and silicon oxide ($SiO_2$).

In FIGS. 8A and 9A, first and second active layers 108 and 112 and first and second ohmic contact layers 110 and 114 may be sequentially formed on the first and second gate electrodes 102 and 104 by depositing and patterning intrinsic amorphous silicon (a-Si) and doped amorphous silicon (n+ or p+ a-Si). In addition, a first contact hole 107 may be formed in the gate insulating layer 106 region to expose an end portion of the second gate electrode 104. Similarly, as shown in FIG. 10A, a dummy pad 105 may be formed on the first substrate 100 and may covered by the gate insulating layer 106. In addition, the dummy pad 105 may be simultaneously formed when the first and second gate electrodes 102 and 104 may be formed.

Figure 8B:
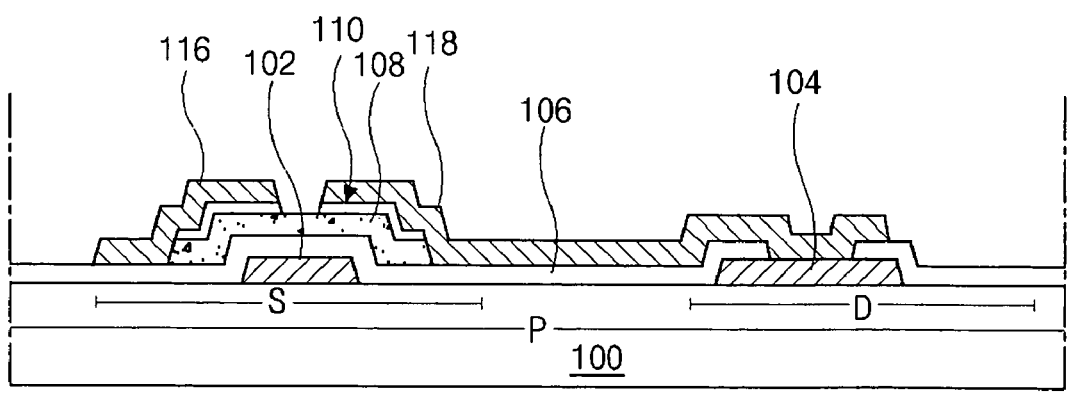
Figure 9B:
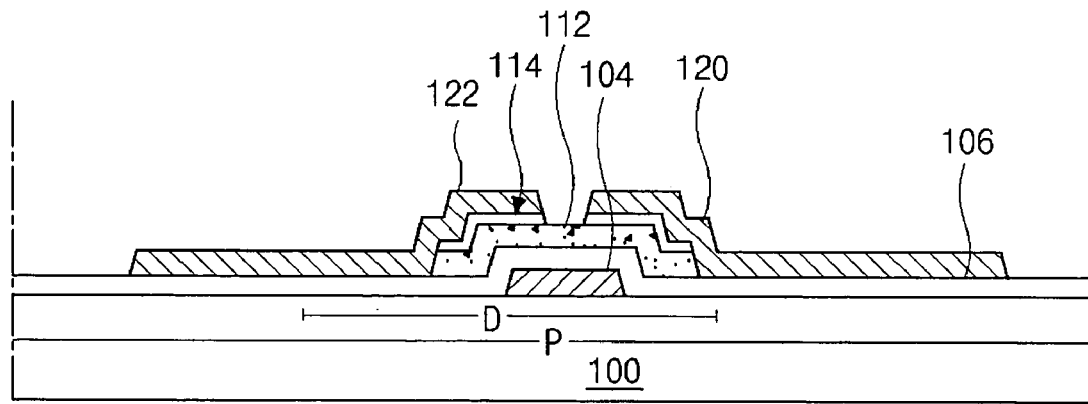

In FIGS. 8B and 9B, first and second source electrodes 116 and 120 and first and second drain electrodes 118 and 122 may be formed on the first and second ohmic contact layers 110 and 114 by depositing and patterning a conductive metallic material, such as chromium (Cr), Mo, Ta, and W. In addition, first and second source electrodes 116 and 120 and first and second drain electrodes 118 and 122 may be separated from each other corresponding to the first and second ohmic contact layers 110 and 114, respectively.

Figure 10B:
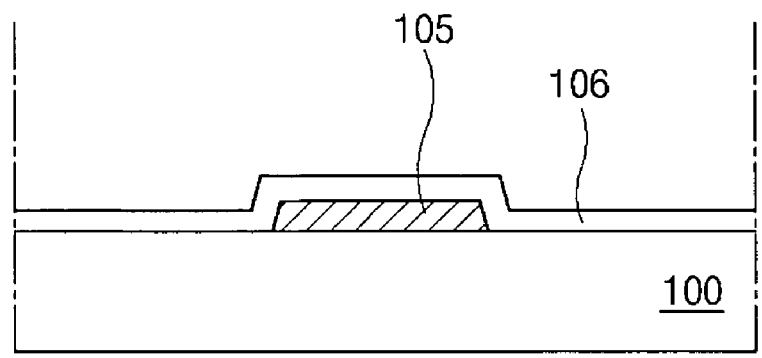

Conversely, as shown in FIG. 10B, the dummy pad 105 in the peripheral region may remain unprocessed.

Although not shown, data lines and data pads may be formed on the first substrate 100 at an end portion of the data lines. The first substrate 100 may include the first and second ohmic contact layers 110 and 114 having a single unitary shape. In addition, the gate and data lines may cross each other, wherein the data lines may be connected to the first source electrode 116. Furthermore, at least one data dummy pad may be made of the same material of the data pads and may be formed during the same process as the data pads.

Figure 8C:
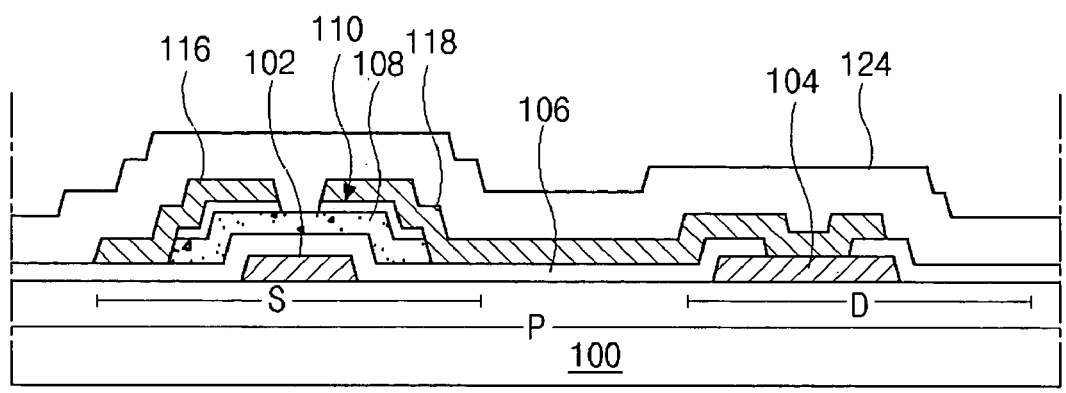
Figure 9C:
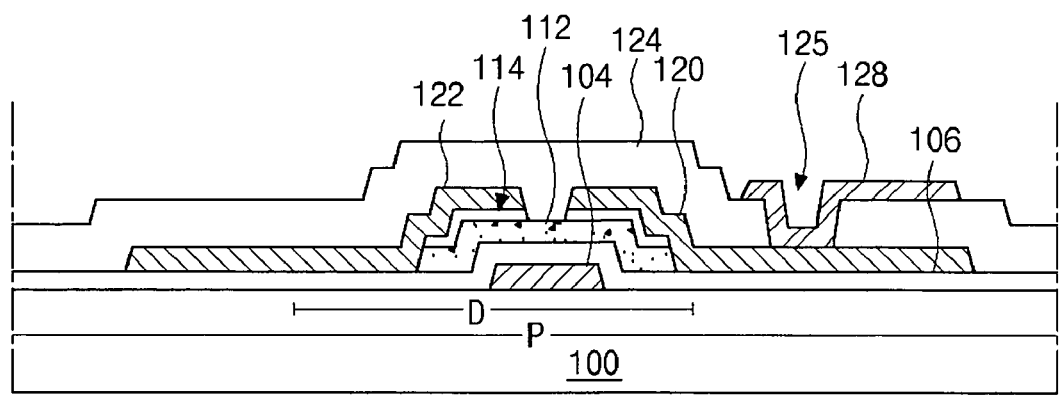
Figure 10C:
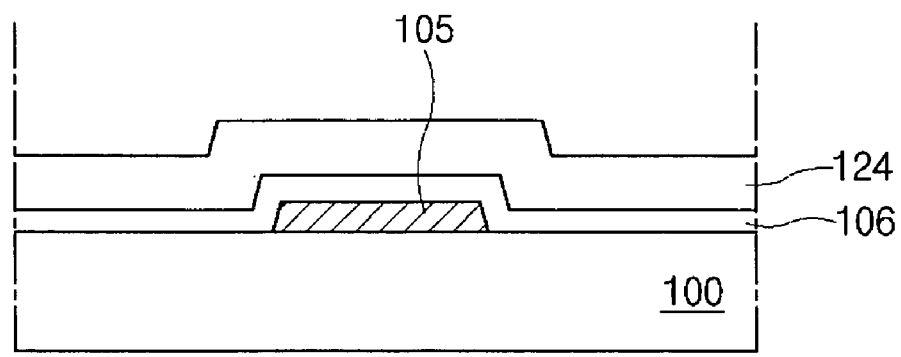

In FIGS. 8C, 9C, and 10C, a first passivation layer 124 may be formed over the first substrate 100 by depositing an inorganic insulating material. In addition, the first passivation layer 124 may have a second contact hole 125 that exposes a portion of the second source electrode 120. Then, a power line 128 may be formed on the first passivation layer 124 by depositing and patterning a conductive metallic material, and may be made of the same material as the source and drain electrodes. Although not shown, ground pads and at least one power dummy pad may be formed at an end portion of a plurality of the power lines 128.

Figure 8D:
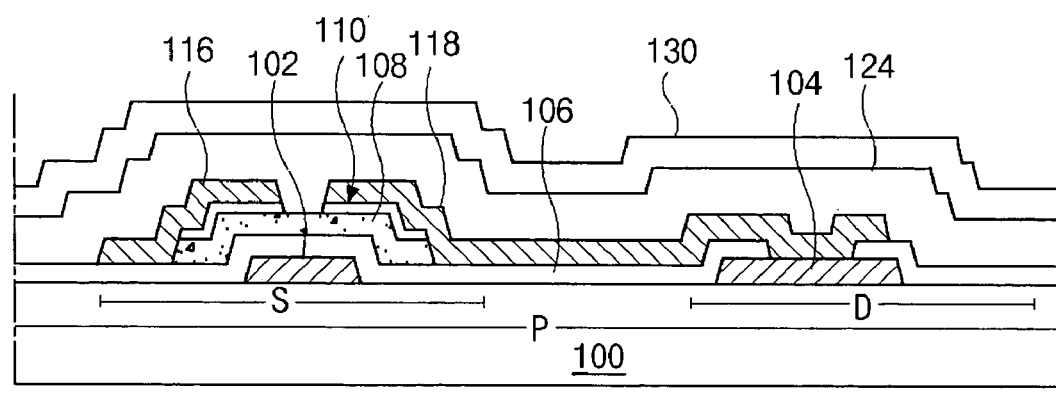
Figure 9D:
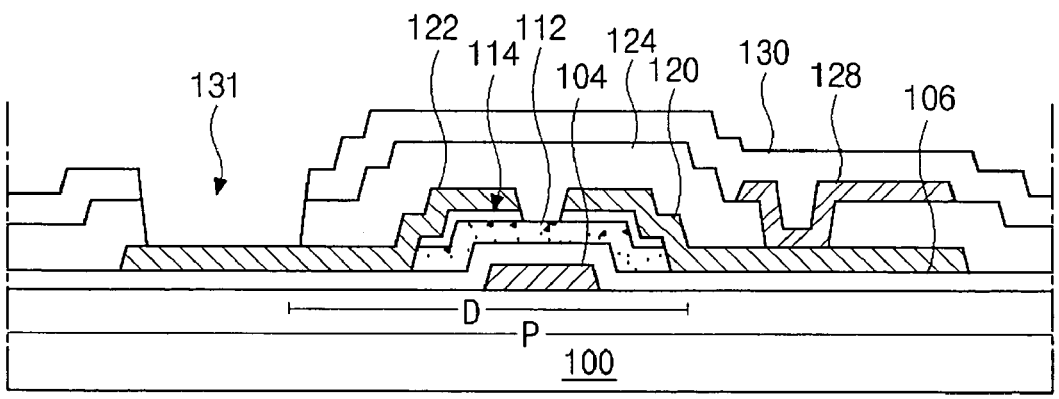
Figure 10D:
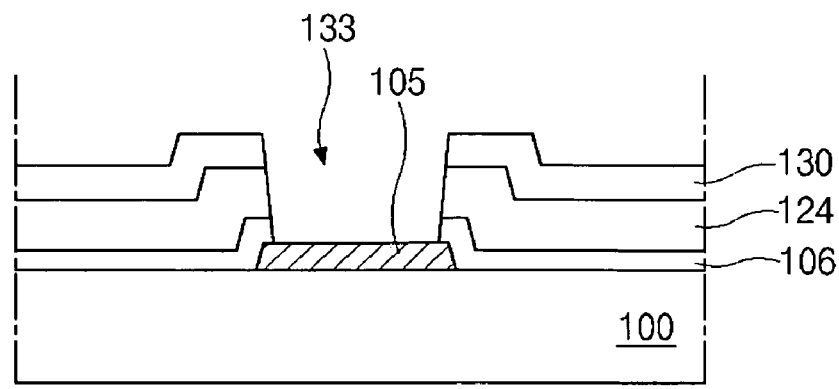

In FIGS. 8D, 9D, and 10D, a second passivation layer 130 may be formed over the first substrate 100 having the power line 128 by coating an inorganic insulating material or an organic insulating material, such as benzocylcobutene (BCB) and an acrylate resin. In addition, third and fourth contact holes 131 and 133 may be formed by patterning the first and second passivation layers 124 and 130. Accordingly, the third contact hole 131 and the fourth contact hole 133 may expose a portion of the second drain electrode 122 and a portion of the gate dummy pad 105, respectively.

Figure 8E:
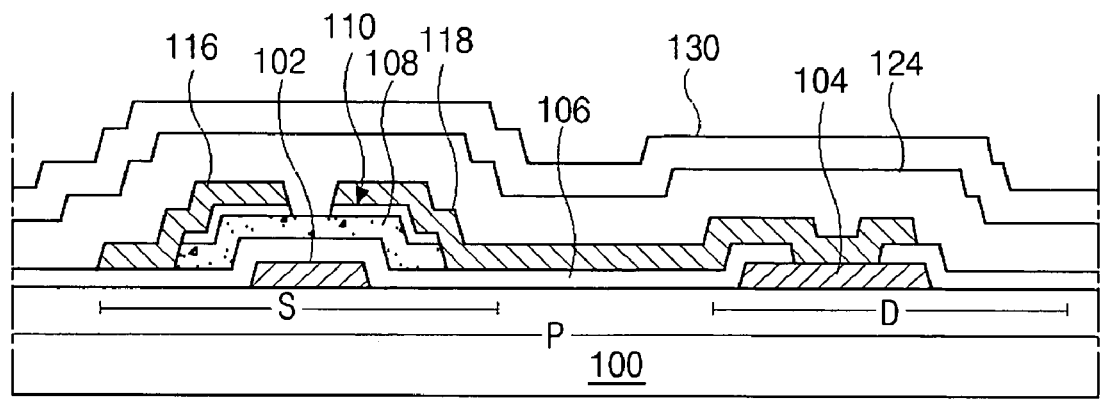
Figure 9E:
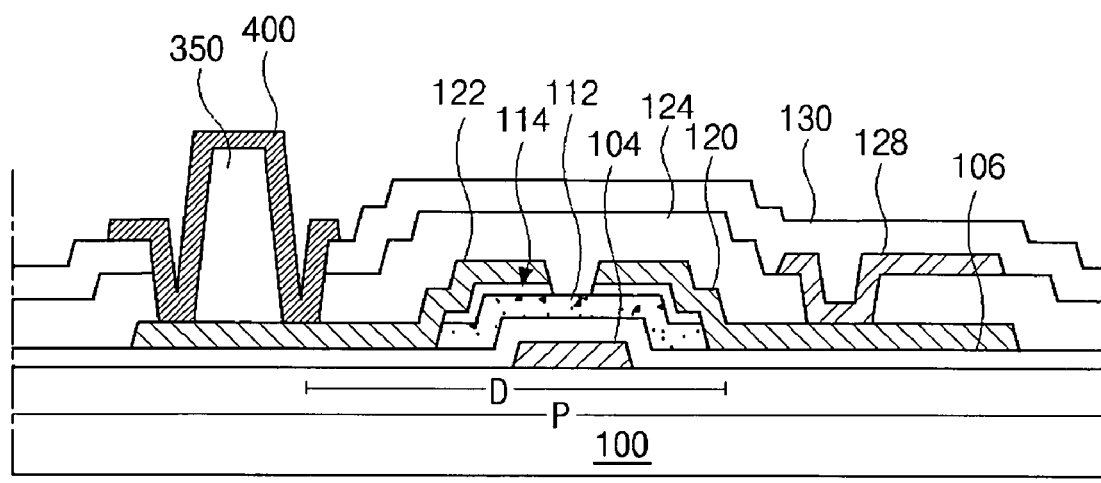
Figure 10E:
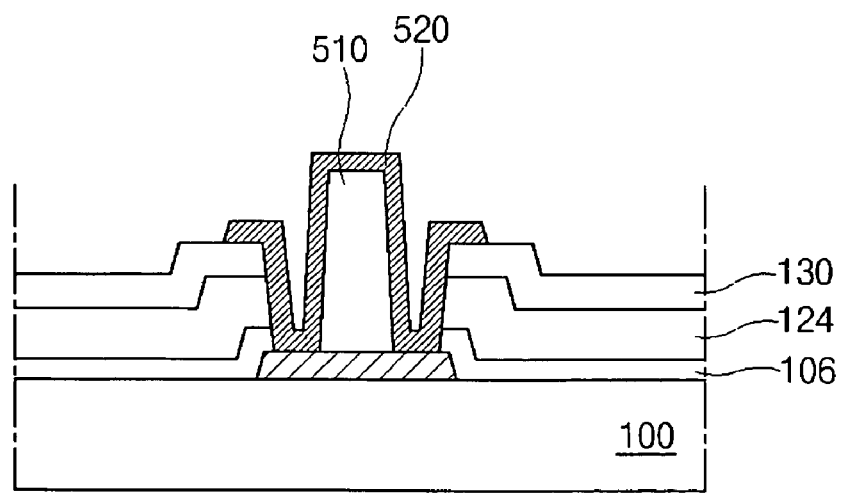

In FIGS. 8E, 9E, and 10E, a connection electrode 400 and a contact electrode 520 may be formed on the second passivation layer 130. The connection electrode 400 may be connected to the second drain electrode 122 via the third contact hole 131, and the contact electrode 520 may be connected to the gate dummy pad via the fourth contact hole 133. Furthermore, first and second organic patterns 350 and 510 may be formed between the connection electrode 400 and the contact electrode 520 in order to provide a fixed depth. In addition, the second electrode 210 (in FIG. 5) may be connected to the driving TFT $T_D$ (in FIG. 5) through the connection electrode 400, and the first electrode 204 (in FIG. 5) may be connected to the gate dummy pad 105 though the contact electrode 520.

Although not shown, when the data dummy pad or power dummy pad is formed, the contact electrode 520 of the data or power dummy pad may be formed. A contact part CP (in FIG. 6) may be formed along the periphery region "PR" and may include a contact metal line interconnecting the first electrode 204 (in FIG. 5) and an outer IC. In addition, the contact electrode 520 may also be formed in the contact part CP (in FIG. 6) in order to interconnect the first electrode 204 (in FIG. 5) and the contact metal line.

Figure 11A:
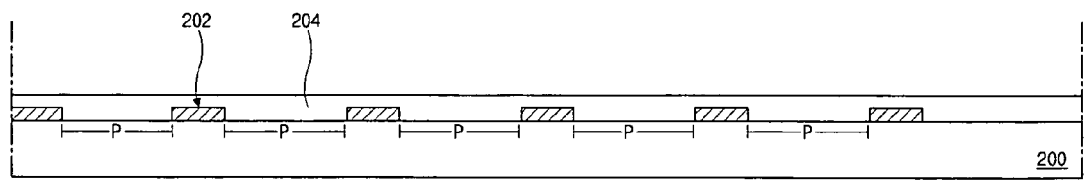
FIGS. 11A to 11C are schematic cross sectional views of another exemplary method of fabricating a dual-plate OELD device according to the present invention.
Figure 11B:
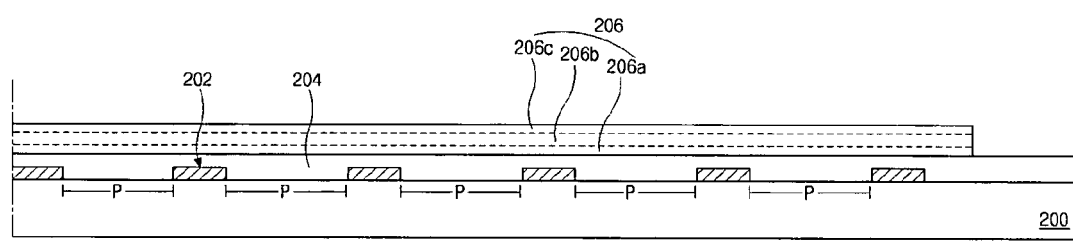
Figure 11C:
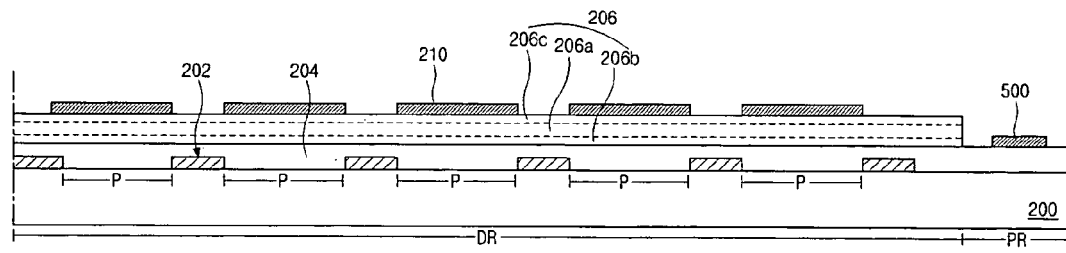

FIGS. 11A to 11C are schematic cross sectional views of another exemplary method of fabricating a dual-plate OELD device according to the present invention. As shown in FIG. 6, a display region DR and a periphery region PR surrounding the display region DR may be defined in a second substrate 200, wherein the display region DR may have a plurality of pixel regions P, as shown in FIG. 11A.

In FIG. 11A, a first auxiliary electrode 202 may be formed by depositing and patterning a low resistance metallic material, such as Cr, Mo, Al, and an Al alloy, and may be located on an inner surface of the second substrate 200 along a boundary region in each of the pixel regions P. Although not shown, the first auxiliary electrode 202 may have a lattice shape, as seen in a plan view. When the first auxiliary electrode 202 functions as a hole injection electrode, it may be made of a transparent material having a high work function, such as indium-tin-oxide (ITO) or indium-zinc-oxide (IZO).

In FIG. 11B, an organic luminescent layer 206 may be formed on the first auxiliary electrode 204. The organic luminescent layer 206 may include red, green, and blue emission layers, and may include a single layer or multiple individual layers. If the organic luminescent layer 206 includes multiple individual layers, the organic luminescent layer 206 may include a hole transporting layer 206a, a main emitting layer 206b, an electron transporting layer 206c.

In FIG. 11C, a plurality of second electrodes 210 may be formed on the organic luminescent layer 206, and each of the second electrodes 210 may be independently located within each of the pixel regions P. If the second electrodes 210 functions as a cathode, the second electrodes 210 may be made of one of Al, calcium (Ca), or magnesium (Mg), or may be made of double metal layers, such as lithium fluorine/aluminum (LiF/Al). Furthermore, second auxiliary electrode 500 may be formed using the same material of the second electrodes along the periphery region of the second substrate through the same process as the second electrodes. Although not shown, the second auxiliary electrode 500 may contacts the contact electrode 520 (in FIG. 10E).

According to the present invention, if an OELD device functions as a top emission-type OELD device, a high aperture ratio may be obtained. In addition, since an array layer including a TFT and an organic EL diode may be independently formed on respective substrates, undesired effects due to fabrication processes of the organic EL diode may be prevented, thereby improving overall production yield. Furthermore, signals of outer ICs along periphery regions may be simultaneously supplied to an organic electroluminescent diode through a contact part and at least one dummy pad disposed at a gate line, a data line, or a power pads. Thus, an additional signal supplying system may not be necessary. In addition, an OELD device according to the present invention may provide uniform quality images, and may be employed in large-sized displays.

It will be apparent to those skilled in the art that various modifications and variations can be made in the OELD device and method of fabricating an OELD of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
    first and second substrates spaced apart from and attached to each other, the first and second substrates including a plurality of pixel regions and a periphery region surrounding the plurality of pixel regions;
    a plurality of gate lines on an inner surface of the first substrate;
    a plurality of data lines crossing the plurality of gate lines;
    a plurality of driving thin film transistors, each of the driving thin film transistors adjacent to one of the plurality of pixel regions;
    a plurality of power lines connected to the driving thin film transistors;
    a plurality of gate pads connected to an end portion of the gate lines within the periphery region;
    a plurality of data pads connected to an end portion of the data lines within the periphery region;
    a plurality of power pads connected to an end portion of the power lines within the periphery region;
    at least one dummy pad within the periphery region, the at least one dummy pad being independent of each of the gate pads, the data pads, and the power pads;
    a first electrode on an inner surface of the second substrate, the first electrode connected to the dummy pad;
    an organic electroluminescent layer on the first electrode;
    a plurality of second electrodes on the organic electroluminescent layer within each of the pixel regions; and
    a plurality of connection electrodes electrically interconnecting the first substrate with the second substrate.

2. The device according to claim 1, wherein the first electrode functions as an anode, and the second electrodes function as a cathode.

3. The device according to claim 2, wherein the first electrode includes one of indium-tin-oxide and indium-zinc-oxide.

4. The device according to claim 3, further comprising a plurality of first auxiliary electrodes along a boundary of each of the pixel regions, the plurality of first auxiliary electrodes having a resistance lower than a resistance of the first electrode.

5. The device according to claim 4, further comprising at least one second auxiliary electrode along the periphery region of the first electrode, the at least one second auxiliary includes the same material as the first electrode.

6. The device according to claim 5, further comprising at least one first contact electrode interconnecting the at least one second auxiliary electrode with the dummy pad within the periphery region, and the second auxiliary connected with the first electrode.

7. The device according to claim 2, wherein the second electrodes include one of calcium (Ca), aluminum (Al), and magnesium (Mg).

8. The device according to claim 1, further comprising at least one first contact electrode interconnecting the first electrode with the dummy pad within the periphery region.

9. The device according to claim 1, wherein the periphery region comprises a contact region, and the first electrode connected with an outer IC.

10. The device according to claim 9, further comprising a contact metal line within the contact region.

11. The device according to claim 9, wherein the contact region comprises a plurality of contact holes, and the first electrode and the outer IC are interconnected to each other through the plurality of contact holes.

12. The device according to claim 9, wherein the contact metal line is connected to the first electrode through at least one second contact electrode.

13. The device according to claim 1, wherein the at least one dummy pad includes a plurality of dummy pads.

14. The device according to claim 13, wherein the plurality of dummy pads are located along sides of the gate pad, the data pad, and the power pad.

15. The device according to claim 1, wherein each of the driving thin film transistors includes a driving active layer, a driving gate electrode, a driving source electrode, and a driving drain electrode.

16. The device according to claim 15, further comprising a plurality of switching thin film transistors connected to the driving thin film transistors, wherein each of the switching thin film transistors includes a switching active layer, a switching gate electrode, a switching source electrode, and a switching drain electrode.

17. The device according to claim 1, further comprising a seal pattern attaching the first substrate and the second substrate together.

18. A method of fabricating an organic electroluminescent device, comprising:
   forming a plurality of gate lines, data lines, and power lines on an inner surface of a first substrate having a plurality of pixel regions and a periphery region surrounding the plurality of pixel regions;
   forming a plurality of driving thin film transistors adjacent to each of the plurality of pixel regions on the inner surface of the first substrate;
   forming a plurality of gate pads, data pads, and power pads connected to an end portions of the gate lines, the data lines, and the power lines, respectively, within the periphery region;
   forming at least one dummy pad within the periphery region independent of the gate pads, the data pads, and the power pads;
   forming a first electrode on an inner surface of a second substrate having the plurality of pixel regions and the periphery region;
   forming an organic electroluminescent layer on the first electrode;
   forming a plurality of second electrodes on the organic electroluminescent layer within each of the pixel regions;
   forming a plurality of connection electrodes on one of first and second substrates; and
   electrically interconnecting the first substrate and the second substrate through the connection electrodes and at least one dummy pad.

19. The method according to claim 18, wherein the first electrode functions as an anode, and the second electrodes function as a cathode.

20. The method according to claim 19, wherein the first electrode includes one of indium-tin-oxide and indium-zinc-oxide.

21. The method according to claim 20, further comprising forming a plurality of first auxiliary electrodes along a boundary of each of the pixel regions, the plurality of first auxiliary electrodes having a resistance lower than a resistance of the first electrode.

22. The method according to claim 21, further comprising at least one second auxiliary electrode along the periphery region, the at least one second auxiliary including the same material as the first auxiliary electrodes.

23. The method according to claim 22, further comprising forming at least one first contact electrode interconnecting the at least one second auxiliary electrode with the dummy pad within the periphery region, and the second auxiliary connected with the first electrode.

24. The method according to claim 23, further comprising forming at least one second organic pattern to provide a fixed depth of the at least one contact electrode.

25. The method according to claim 19, where the second electrodes include one of calcium (Ca), aluminum (Al) and magnesium (Mg).

26. The method according to claim 19, wherein the periphery region comprises a contact region, and the first electrode connects with an outer IC.

27. The method according to claim 26, further comprising forming a contact metal line within the contact region.

28. The method according to claim 27, wherein the contact metal line interconnects the first electrode through at least one second contact electrode.

29. The method according to claim 26, wherein the contact region includes a plurality of contact holes, and the first electrode and the outer IC are interconnected through the plurality of contact holes.

30. The method according to claim 18, further comprising forming at least one first contact electrode interconnecting the first electrode with the dummy pad within the periphery region.

31. The method according to claim 18, wherein the at least one dummy pad includes a plurality of dummy pads.

32. The method according to claim 31, wherein the plurality of dummy pads are located along sides of the gate pads, the data pads, and the power pads.

33. The method according to claim 18, wherein each of the driving thin film transistors includes a driving active layer, a driving gate electrode, a driving source electrode, and a driving drain electrode.

34. The device according to claim 33, further comprising switching thin film transistors each interconnected with the driving thin film transistors, wherein each of the switching thin film transistor includes a switching active layer, a switching gate electrode, a switching source electrode, and a switching drain electrode.

35. The method according to claim 18, further comprising attaching the first substrate and the second substrate with a seal pattern.

36. The method according to claim 18, further comprising forming first organic patterns to provide a fixed depth of the connection electrodes.

37. The method according to claim 18, wherein the first electrode is interconnected with the at least one dummy pad through the at least one dummy pad.

* * * * *